(12) United States Patent
Ku

(10) Patent No.: US 6,504,746 B2
(45) Date of Patent: Jan. 7, 2003

(54) HIGH-DENSITY LOW-COST READ-ONLY MEMORY CIRCUIT

(75) Inventor: Joseph Weiyeh Ku, Palo Alto, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/871,504

(22) Filed: May 31, 2001

(65) Prior Publication Data

US 2002/0184433 A1 Dec. 5, 2002

(51) Int. Cl.[7] .............................................. G11C 17/00
(52) U.S. Cl. ............................ 365/94; 365/52; 365/63; 365/105
(58) Field of Search ............................. 365/51, 52, 94, 365/105, 103, 63

(56) References Cited

U.S. PATENT DOCUMENTS

| | | | | |
|---|---|---|---|---|
| 4,467,400 A | * | 8/1984 | Stopper | 361/767 |
| 4,614,194 A | * | 9/1986 | Jones et al. | 607/2 |
| 5,291,061 A | * | 3/1994 | Ball | 257/686 |
| 5,835,396 A | * | 11/1998 | Zhang | 365/51 |
| 6,014,586 A | * | 1/2000 | Weinberg et al. | 607/36 |
| 6,205,082 B1 | * | 3/2001 | Tomita et al. | 365/233 |
| 6,272,069 B2 | * | 8/2001 | Tomita et al. | 365/233 |
| 6,291,836 B1 | * | 9/2001 | Kramer et al. | 257/50 |

OTHER PUBLICATIONS

Dr. Guobiao (George) Zhang—"Welcome to 3D–Rom, Inc!"—pp. 1–5.
Dr. Guobiao (George) Zhang—"3D–ROM—A First Practical Step Towards 23D–IC"—Jul. 2000—pp. 1–7.

* cited by examiner

Primary Examiner—David Nelms
Assistant Examiner—Gene N Auduong

(57) ABSTRACT

A high-density low-cost read-only memory circuit is disclosed. Within the memory circuit, a passive device chip, including only passive devices is configured to form a read-only memory array; and an active device chip, having supporting circuitry electrically coupled to the memory array. The passive chip may include amorphous or poly-Silicon diodes; the supporting circuitry may include bit-line, word-line, address decoder; sense amplifier, and output driver circuitry. The memory array may further include a first memory array; and a second memory array, deposited upon the first memory array layer, together forming a three-dimensional multi-layer compact memory circuit. The passive and active chips may be coupled together and encapsulated within a multi-chip module (MCM) package. The MCM package may further include any number of additional passive memory arrays connected to the active chip.

14 Claims, 2 Drawing Sheets

HIGH-DENSITY LOW-COST READ-ONLY MEMORY CIRCUIT

BACKGROUND OF THE INVENTION

1. Field of the Invention

The present invention relates generally to semiconductor memories, and more particularly to high density and high capacity memory circuits.

2. Discussion of Background Art

Advances in information technology and the internet demand constant improvements in computer architecture, interconnectivity, and data storage. Presently, the latter, data storage, is served by a variety of devices such as flash memory, disk drives, conventional ROM chips, CD-ROMs, RAMs as well as other memory devices. Memory devices which enable an increasingly greater amount of information to be stored at lower cost with faster access times are constantly sought.

Conventional read-only memory (ROM) chips contain many active devices which are fabricated using various high-temperature processes that are very time consuming and add significant cost to each memory chip. Such ROMs are also typically two-dimensional devices having limited memory density for their die size.

In search of increased memory capacity, some memory designers have explored three dimensional semiconductor memory devices such as is discussed in U.S. Pat. No. 5,835,396 entitled, "Three-Dimensional Read-Only Memory" by G. Zhang, and issued on Nov. 10, 1998. Zhang discloses a read-only memory structure, having a three dimensional arrangement of memory elements. The three-dimensional read-only memory is formed on a semiconductor substrate. Transistors are built on this semiconductor substrate using standard technology. These transistors provide means to select, program, and read a certain memory element from a signal originating at I/O pads. Each memory element provides a coupling mechanism between two address select lines—a word line and a bit line. The memory elements are partitioned into multiple memory levels. Each memory level is stacked on top of another. Within each memory level, there are a plurality of memory elements and address select lines.

However, Zhang's ROM chip contains a plurality of active devices which are costly to fabricate. Also, in order to stack multiple memory layers, Zhang requires that chemical mechanical polishing (CMP) techniques be used to flatten the memory chip's surface before additional memory layers can be added.

Furthermore, Zhang builds his semiconductor ROM array on top of an already complicated VLSI technology circuit. Thus the cost of fabricating Zhang's design is most likely too expensive to result in a practical, economically viable memory device.

In response to the concerns discussed above, what is needed is a memory chip design which overcomes the problems of the prior art discussed above.

SUMMARY OF THE INVENTION

The present invention is a high-density low-cost read-only memory circuit. Within the memory circuit of the present invention, a passive device chip, including only passive devices is configured to form a read-only memory array; and an active device chip, having supporting circuitry electrically coupled to the memory array.

In other aspects of the invention: the passive chip may include amorphous or poly-Silicon diodes; the supporting circuitry may include bit-line, word-line, address decoder; sense amplifier, and output driver circuitry. The memory array may further include a first memory array; and a second memory array, deposited upon the first memory array layer, together forming a three-dimensional multi-layer compact memory circuit. The passive and active chips may be coupled together and encapsulated within a multi-chip module (MCM) package. The MCM package may further include any number of additional passive memory arrays connected to the active chip.

The circuit of the present invention is particularly advantageous over the prior art because by separating passive circuit components from active circuit components, the passive chip may be fabricated using much less costly and lower temperature amorphous or poly-Silicon processing techniques. In fact due to the present invention's lower manufacturing cost, the present invention may supplant existing CD-ROM and gaming masked ROM technologies.

These and other aspects of the invention will be recognized by those skilled in the art upon review of the detailed description, drawings, and claims set forth below.

DETAILED DESCRIPTION OF THE PREFERRED EMBODIMENT

Figure 1:
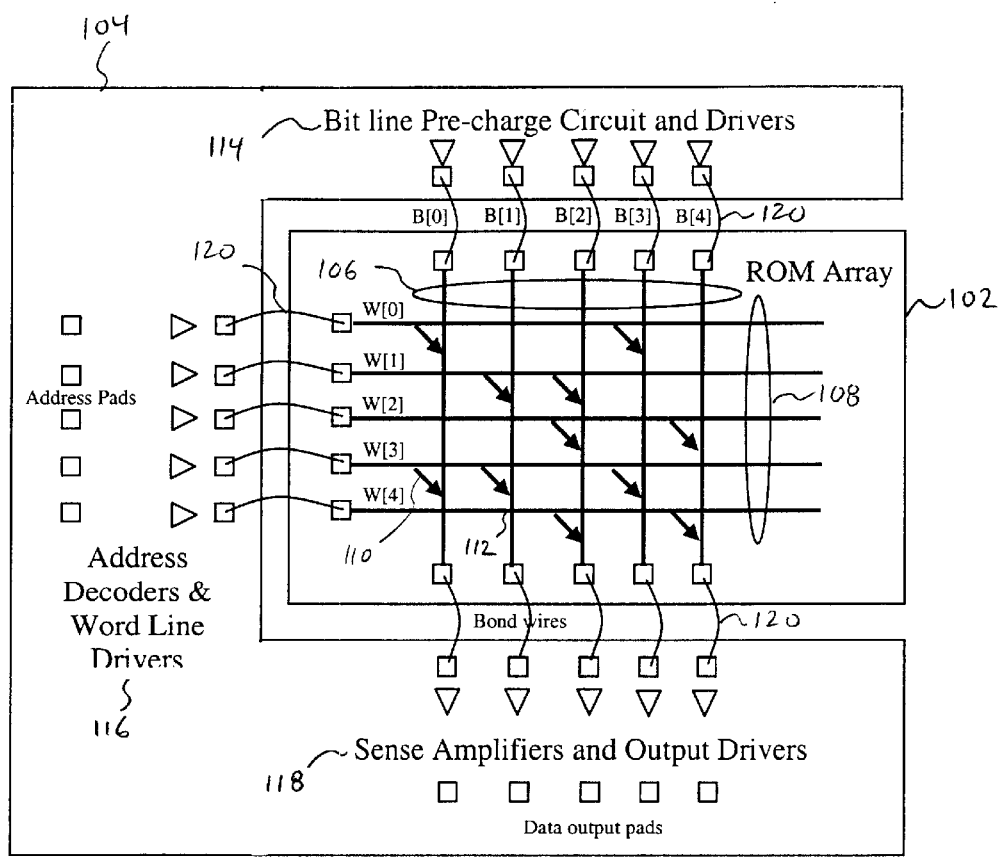
FIG. 1 is a pictorial diagram of a high-density low-cost memory circuit.

FIG. 1 is a pictorial diagram of a high-density low-cost read-only memory circuit 100. The circuit 100 is preferably apportioned between a passive device chip 102 and an active device chip 104.

The passive device chip 102 incorporates a read-only memory array comprised of bit-lines 106 and word-lines 108. In the embodiment shown, there are five bit-lines 106 (B[0], B[1], B[2], B[3], and B[4]), and five word-lines 108 (W[0], W[1], W[2], W[3], and W[4]). Those skilled in the art however will know that any number of bit and word lines may be used. The passive chip 102 preferably contains only passive devices, such as diodes, resistors, capacitors and inductors, which primarily form the read-only memory array. Since only passive devices are used, the passive chip 102 can be fabricated very inexpensively, using low-temperature amorphous-silicon process technology. Thus expensive and complex high-temperature and ion implantation processes can be avoided. The result is a significant reduction in manufacturing costs for the read-only memory array.

The memory array itself is preferably programmed using a diode connection 110 or no connection 112 between the bit-lines 106 and word-lines 108. This programming can be effected in a customized manner during fabrication, or in a generic manner using fusible-link circuits which can be programmed after fabrication. Those skilled in the art will recognize that the memory array could also be fabricated using refreshable capacitors or other memory techniques instead of using diodes.

Also, since the passive chip 102 does not contain active devices, complicated multi-layer wafer processing typically used to make active devices, are not required. Thus the passive chip's 102 topology should be quite flat. This flat topology is amenable toward stacking additional memory arrays on top of the memory array. This permits an enormous increase in memory density and capacity without increasing die size or wafer processing complexity. Costly chemical mechanical polishing (CMP) techniques that would otherwise be required to flatten the array's surfaces before adding another memory array layer would not be required. For example, if the memory array has a 32MB capacity, stacking three additional memory arrays onto the memory array would result in a 128MB total read-only memory array which could be very inexpensively fabricated.

While, the amorphous-silicon diodes within the memory array would typically require a high (3.3 V) turn on voltage, the memory array could be tailored to low power applications by using poly-silicon to fabricate the diodes. Poly-silicon diodes turn on at a much lower voltage (1.5V), however, since poly-silicon requires slightly higher-temperature CVD processes to fabricate, bit-line 106 and word line 108 metal interconnects are preferably fabricated with refractory metals, such as tungsten or silicide. Aluminum would not be preferred due to aluminum's low melting point.

The active device chip 104 preferably contains any necessary support circuitry for the passive device chip 102. Preferably the support circuitry on the active chip 104 consists primarily of active devices and other electronics which require expensive and complex multi-step wafer processing steps, such as high-temperature exposures, ion implantation and CMP processes, to fabricate. By aggregating all active devices on a single preferably compact CMOS chip, the overall cost of manufacturing the read-only memory circuit 100 can be dramatically reduced.

The supporting circuitry includes, bit-line pre-charge circuits and drivers 114, address decoders and word-line drivers 116, and sense amplifiers and output drivers 118, which are powered by 3.3V or 5V. This circuitry can be fabricated using regular CMOS VLSI technology processes. The active chip 104 is coupled to the passive chip 102 by a series of bonding wires 120.

Timing protocols between the bit-lines 106 and word lines 108 are conventional. During operation, the bit-lines 106 are first pre-charged to "0". Then, depending upon an access address, a particular word-line is driven to 3.3V, for amorphous-silicon diodes. If a diode connects that word-line and a particular bit-line, then that bit line will sense a current flow and amplify the signal to a logical "1". Otherwise, if there is no connection between word-line and that bit-line, the bit-line remains a logical "0". Thus information coded in the read-only memory circuit 100 can be decoded and output.

Figure 2:
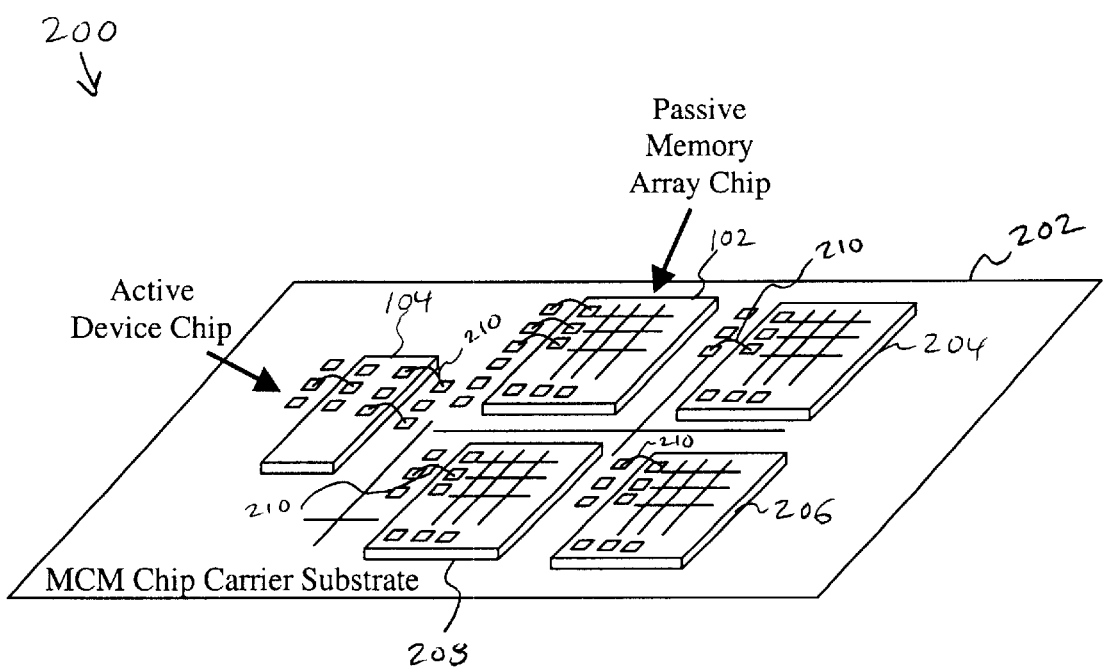
FIG. 2 is a pictorial diagram of Multi-Chip-Module (MCM) containing the high-density low-cost memory circuit.

FIG. 2 is a pictorial diagram of Multi-Chip-Module (MCM) 202 containing the passive memory array chip 102, the active device chip 104, and a plurality of other passive memory array chips 204, 206, and 208. The MCM 202 thus enables the present invention to be embodied within a single small form-factor package incorporating any desired number of low-cost high-density passive memory array chips. The actual number of passive chips included within any single MCM is implementation specific. All of the chips are interconnected by bond wires 210 to the MCM substrate or to each other.

While one or more embodiments of the present invention have been described, those skilled in the art will recognize that various modifications may be made. Variations upon and modifications to these embodiments are provided by the present invention, which is limited only by the following claims.

What is claimed is:

1. A memory circuit, comprising:

a passive device chip, including only passive devices configured to form a read-only memory array; and an active device chip, having supporting circuitry electrically coupled to the memory array, where the passive device chip is not stacked on the active device chip and where the supporting circuitry for the read-only memory array is external to the passive device chip.

2. The circuit of claim 1, wherein the passive devices include:

amorphous-Silicon diodes.

3. The circuit of claim 1, wherein the passive devices include:

poly-Silicon diodes.

4. The circuit of claim 1, wherein the passive chip and the active chip are coupled together with bond wires.

5. The circuit of claim 1, wherein the supporting circuitry includes:

bit-line circuitry; and word-line circuitry.

6. The circuit of claim 5, wherein the supporting circuitry further includes:

an address decoder;

a sense amplifier; and an output driver.

7. The circuit of claim 1, wherein the memory array comprises:

a first memory array; and a second memory array, deposited upon the first memory array layer.

8. The memory circuit of claim 7, wherein the second memory array can be stacked on top of the memory array.

9. The circuit of claim 8, further comprising:

a second passive device chip, coupled to the multi-chip module and the active chip.

10. The circuit of claim 9, wherein the second passive device chip includes:

a second read-only memory array electrically coupled to the supporting circuitry.

11. The circuit of claim 1, further comprising:

a multi-chip module, to which the passive chip and the active chip are physically coupled.

12. A memory circuit, comprising:

a passive device chip, including only passive devices, including amorphous-Silicon diodes, configured to form a read-only memory array;

an active device chip, having supporting circuitry electrically coupled to the memory array with bond wires, where the passive device chip is not stacked on the active device chip and where the supporting circuitry for the read-only memory array is external to the passive device chip; and a multi-chip module, to which the passive chip and the active chip are physically coupled.

13. The memory circuit of claim 1, wherein the passive device chip is separate from the active device chip.

14. The memory circuit of claim 12, wherein the passive device chip is separate from the active device chip.

* * * * *